United States Patent
Inaba et al.

(10) Patent No.: US 9,419,163 B2
(45) Date of Patent: Aug. 16, 2016

(54) SOLAR PANEL AND METHOD FOR MANUFACTURING THE SAME

(71) Applicant: KABUSHIKI KAISHA TOYOTA JIDOSHOKKI, Kariya-shi, Aichi-ken (JP)

(72) Inventors: Hirotaka Inaba, Kariya (JP); Hitoshi Sekita, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 96 days.

(21) Appl. No.: 14/200,823

(22) Filed: Mar. 7, 2014

(65) Prior Publication Data
US 2014/0251415 A1    Sep. 11, 2014

(30) Foreign Application Priority Data

Mar. 8, 2013 (JP) .................................. 2013-046903
May 10, 2013 (JP) .................................. 2013-099829
Feb. 24, 2014 (JP) .................................. 2014-033202

(51) Int. Cl.
| | |
|---|---|
| *H01L 31/042* | (2014.01) |
| *H01L 31/048* | (2014.01) |
| *B62D 25/06* | (2006.01) |
| *B60K 16/00* | (2006.01) |
| *H02S 10/40* | (2014.01) |

(52) U.S. Cl.
CPC .......... *H01L 31/048* (2013.01); *H01L 31/0488* (2013.01); *B60K 2016/003* (2013.01); *B62D 25/06* (2013.01); *H02S 10/40* (2014.12); *Y02E 10/50* (2013.01); *Y02T 10/90* (2013.01)

(58) Field of Classification Search
CPC .............. H01L 31/048; H01L 31/0481; H01L 31/0488; H01L 31/049
USPC .......................................................... 136/251
See application file for complete search history.

(56) References Cited

U.S. PATENT DOCUMENTS 3,565,719 A * 2/1971 Webb ...................... B32B 15/14
                                                          136/244
4,717,790 A * 1/1988 Gochermann .... B32B 17/10036
                                                          136/251

(Continued)

FOREIGN PATENT DOCUMENTS

| CH | 683730 A5 | 4/1994 | |
| DE | 102004003328 A1 * | 8/2005 | .............. B29C 65/02 |

(Continued)

OTHER PUBLICATIONS

Machine Translation of DE102004003328, pub. Aug. 2005.*

(Continued)

*Primary Examiner* — Allison Bourke
(74) *Attorney, Agent, or Firm* — Sughrue Mion, PLLC

(57) ABSTRACT

A solar panel capable of exhibiting excellent aesthetics and power generation efficiency, and capable of easily forming a protection plate in a manufacturing process is provided. The solar panel of the present invention comprises a protection plate 1 having translucency from a front surface 1a to a back surface, a solar battery cell, and an encapsulant that is integrally provided on the back surface, and fixes the solar battery cell to the back surface in sealed state. The protection plate is formed from a resin with polycarbonate as a main component by injection molding. The front surface serves as a design surface. A portion of the back surface that faces the solar battery cell serves as an offset surface that is offset with respect to the solar battery cell, and differs from the design surface in shape.

4 Claims, 13 Drawing Sheets

(56) References Cited

U.S. PATENT DOCUMENTS

| | | | | |
|---|---|---|---|---|
| 5,059,254 | A | * | 10/1991 | Yaba ................ B32B 17/10018 136/244 |
| 2003/0005954 | A1 | * | 1/2003 | Emoto ................ H01L 31/048 136/244 |
| 2006/0076047 | A1 | * | 4/2006 | Green .................... B29C 39/10 136/243 |
| 2011/0042768 | A1 | * | 2/2011 | Kurokawa ................ G09F 9/33 257/432 |
| 2011/0146780 | A1 | * | 6/2011 | Ryu .................... H01L 31/048 136/256 |
| 2012/0153684 | A1 | | 6/2012 | Demmer et al. |
| 2013/0160824 | A1 | * | 6/2013 | Khouri ................ H01L 31/048 136/251 |

FOREIGN PATENT DOCUMENTS

| | | |
|---|---|---|
| DE | 102008038647 A1 | 2/2010 |
| EP | 1782948 A1 | 5/2007 |
| JP | 62-126850 U | 8/1987 |
| JP | 2002-270881 A | 9/2002 |
| WO | 2009108874 A2 | 9/2009 |

OTHER PUBLICATIONS

Communication dated Aug. 28, 2014, issued by the European Patent Office in counterpart Application No. 14157762.7.

Communication dated Mar. 17, 2015, issued by the Japanese Patent Office in counterpart Japanese application No. 2014-033202.

* cited by examiner

SOLAR PANEL AND METHOD FOR MANUFACTURING THE SAME

BACKGROUND OF THE INVENTION

The present invention relates to a solar panel and a method for manufacturing the same.

A known solar panel is disclosed in Toyota Motor Corporation website "toyota.jp PRIUS|FUNCTION/MECHANISM|BODY" <URL: http://toyota.jp/prius/003_p_007/dynamism/body/index.html>. As shown in FIG. 14 of the present application, it is known that such a solar panel, which is illustrated as a solar panel 82, is used in a roof 81 of a vehicle 80. As shown in FIG. 15, the solar panel 82 is composed of a protection plate 90, a plurality of solar battery cells 91, an encapsulant 92 and a film 93. The protection plate 90 is formed from inorganic glass having translucency from a front surface 90a that serves as a design surface to a back surface 90b. The respective solar battery cells 91 adopt crystalline silicon and are formed into flat plate shapes. The encapsulant 92 is integrally provided on the back surface 90b of the protection plate 90. The encapsulant 92 fixes the respective solar battery cells 91 to the back surface 90b of the protection plate 90 in sealed state. The film 93 is provided on a back surface of the encapsulant 92.

The solar panel 82 forms a solar ventilation system in the vehicle 80. Thus, the solar panel 82 can supply, among other purposes, electric power for ventilating a vehicle interior while the vehicle 80 is parked, for example, in the summer season.

The solar panel 82 is manufactured substantially as follows. First, inorganic glass in a flat plate shape is prepared. Subsequently, the inorganic glass is heated to be bent into the protection plate 90. In the protection plate 90, the front surface 90a serves as the design surface along the roof 81. Subsequently, an encapsulant 92a is disposed on the back surface 90b of the protection plate 90, the respective solar battery cells 91 are disposed next, and an encapsulant 92b is disposed on the back surfaces of the respective solar battery cells 91. In this manner, the encapsulant 92 is provided on the back surface 90b of the protection plate 90. Thereafter, the film 93 is provided on the back surface of the encapsulant 92b, and thereafter, the encapsulants 92a and 92b are brought into close contact with each other. Thus, the respective solar battery cells 91 are fixed to the back surface 90b in sealed state by the encapsulant 92.

However, in the conventional solar panels as described above, the protection plate 90 in the above solar panels may be difficult to form in the manufacturing process.

The present invention has been made in the light of the conventional circumstances described above, and an object thereof is to provide a solar panel capable of exhibiting excellent aesthetics and power generation efficiency, and capable of easily forming in a manufacturing process.

SUMMARY OF THE INVENTION

A solar panel of the present invention comprises a protection plate that has translucency from a front surface to a back surface, a solar battery cell, and an encapsulant that is integrally provided on the back surface and fixes the solar battery cell to the back surface in sealed state. The protection plate is formed from a resin. The front surface serves as a design surface. A portion of the back surface that faces the solar battery cell serves as an offset surface that is offset with respect to the solar battery cell, and differs from the design surface in shape.

Other aspects and advantages of the invention will be apparent from embodiments disclosed in the attached drawings, illustrations exemplified therein, and the concept of the invention.

BRIEF DESCRIPTION OF DRAWINGS

The invention will be described in more detail along with the concept and advantages thereof by referring to the attached drawings and the detailed description of the preferred embodiments below.

FIG. 3(A) shows a sectional view of a first die and a second die at a time of a preparation step.

FIG. 3(B) shows a sectional view of the first die, a protection plate and the second die at a time of an injection step.

FIG. 3(C) shows a sectional view of the first die, the protection plate and the second die at a time of a die opening step.

FIG. 4(A) shows a sectional view of a vacuum forming jig, and the protection plate.

FIG. 4(B) shows a sectional view of the vacuum forming jig, the protection plate, the solar battery cells, an encapsulant, a film and a force plunger at a time of a sealing step.

FIG. 4(C) shows a sectional view of the vacuum forming jig, the solar panel and the force plunger.

FIG. 7(A) shows a sectional view of a first die and a second die at a time of a preparation step.

FIG. 7(B) shows a sectional view of the first die, a protection plate and the second die at a time of an injection step.

FIG. 7(C) shows a sectional view of the first die, the protection plate and the second die at a time of a die opening step.

FIG. 8(A) shows a sectional view of a vacuum forming jig and the protection plate.

FIG. 8(B) shows a sectional view of the vacuum forming jig, the protection plate, solar battery cells, an encapsulant, a film and a force plunger.

FIG. 8(C) shows a sectional view of the vacuum forming jig, the solar panel and the force plunger.

DETAILED DESCRIPTION OF THE PREFERRED EMBODIMENTS

Hereinafter, embodiments 1 to 3 in which the present invention is embodied will be described with reference to the drawings.

Embodiment 1

Figure 1:
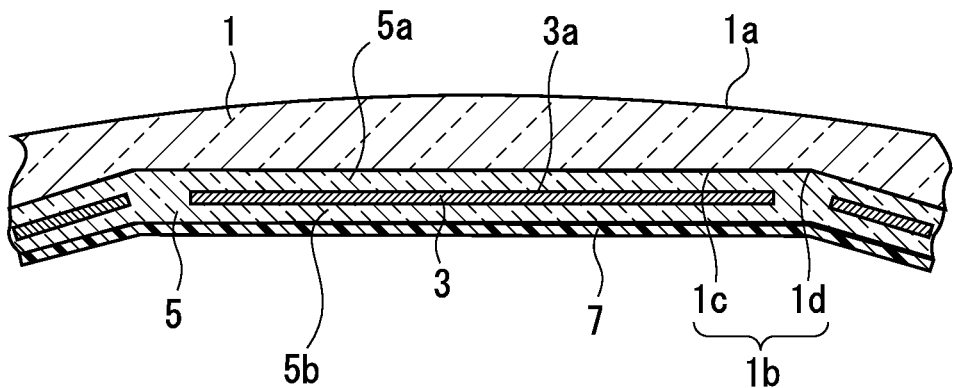
FIG. 1 is an enlarged sectional view of a solar panel of embodiment 1.
Figure 2:
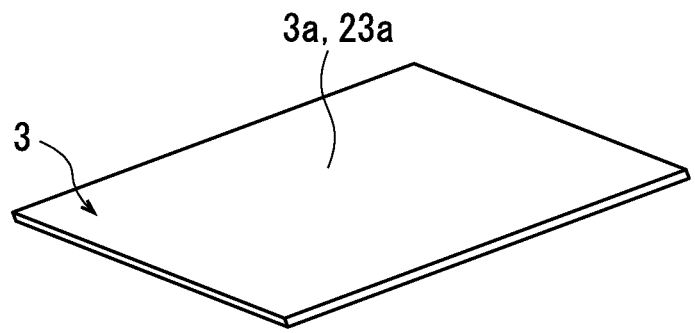
FIG. 2 is a perspective view of a solar battery cell in a flat shape.

As shown in FIG. 1, a solar panel of embodiment 1 is composed of a protection plate 1, a plurality of solar battery cells 3, an encapsulant 5 and a film 7. The protection plate 1 has polycarbonate as a main component. The protection plate 1 has translucency from a front surface 1a that serves as a design surface to a back surface 1b. As the respective solar battery cells 3, crystalline silicon is adopted. As shown in FIG. 2, in the respective solar battery cells 3, cell surfaces 3a are flat surfaces in ordinary state. As shown in FIG. 1, the encapsulant 5 is integrally provided on the back surface 1b of the protection plate 1. The encapsulant 5 fixes the respective solar battery cells 3 to the back surface 1b in sealed state. The film 7 is provided on a back surface of the encapsulant 5.

The back surface 1b of the protection plate 1 is composed of offset surfaces 1c that face the respective solar battery cells 3, and bending surfaces 1d that connect the respective offset surfaces 1c. The offset surface 1c differs from the design surface of the front surface 1a of the protection plate 1, and forms flatness that is offset with respect to the cell surface 3a of the solar battery cell 3.

Figure 3A:
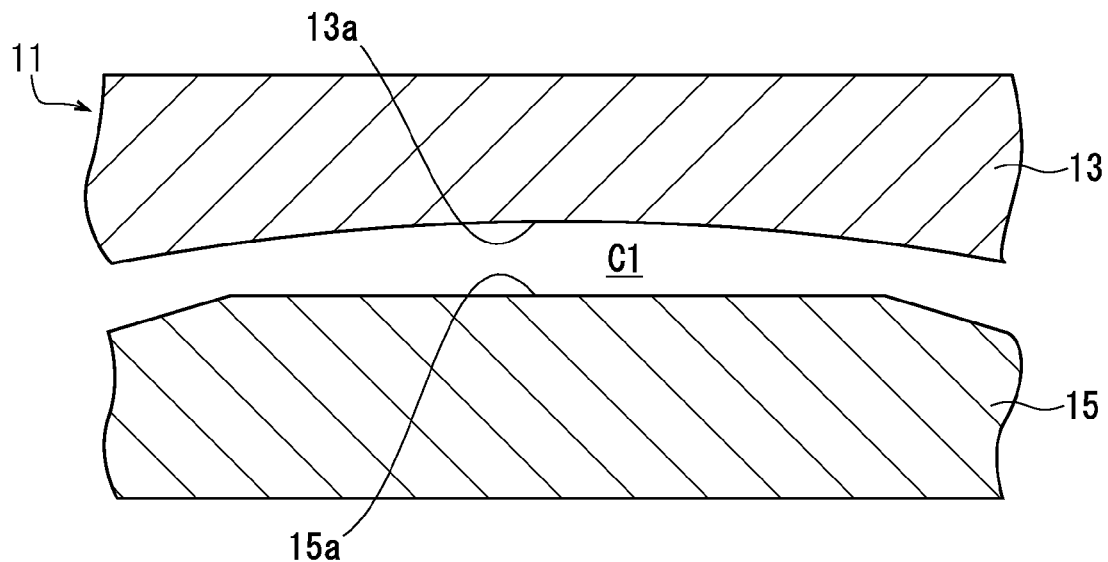
FIG. 3(A) is an enlarged sectional view showing a method for manufacturing the solar panel of embodiment 1.

The solar panel is manufactured as follows. First, as shown in FIG. 3(A), as a preparation step, a molding die 11 is prepared. The molding die 11 has a first die 13 and a second die 15.

Figure 3B:
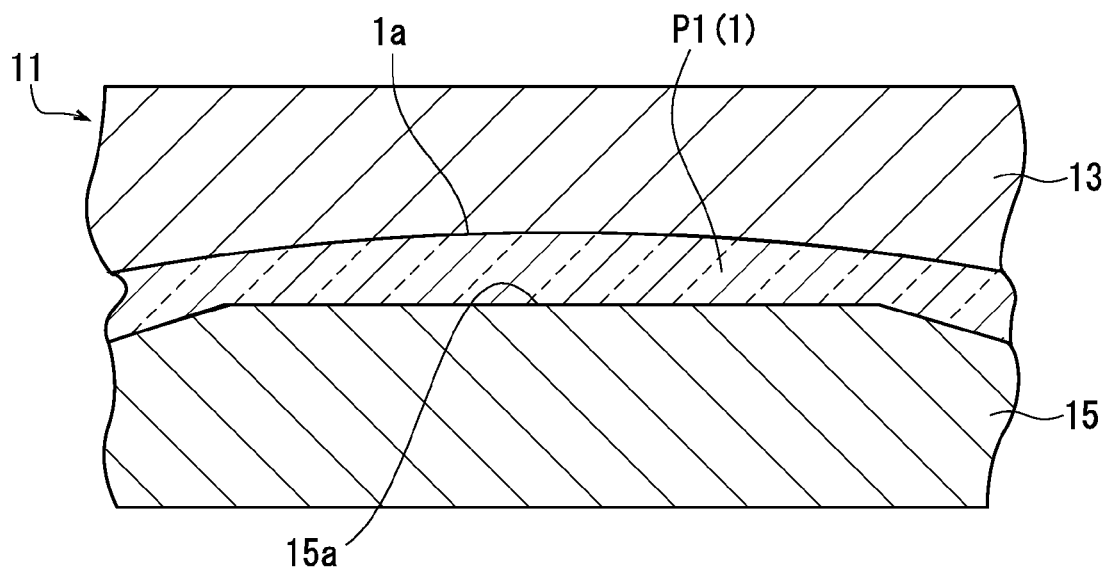
FIG. 3(B) is an enlarged sectional view showing the method for manufacturing the solar panel of embodiment 1.
Figure 3C:
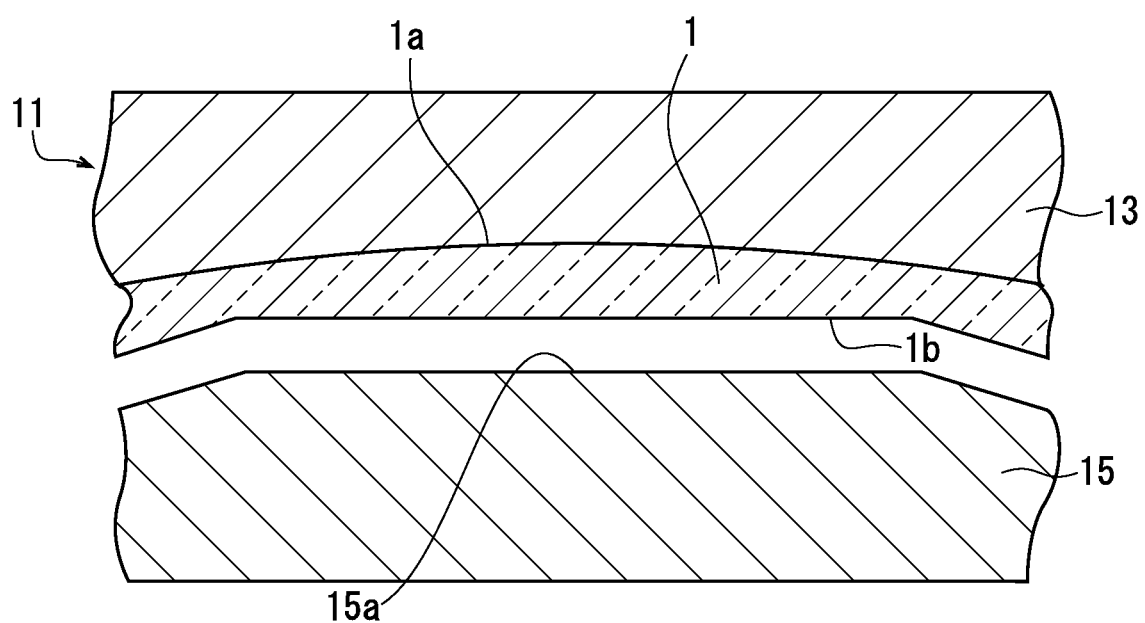
FIG. 3(C) is an enlarged sectional view showing the method for manufacturing the solar panel of embodiment 1.
Figure 14:
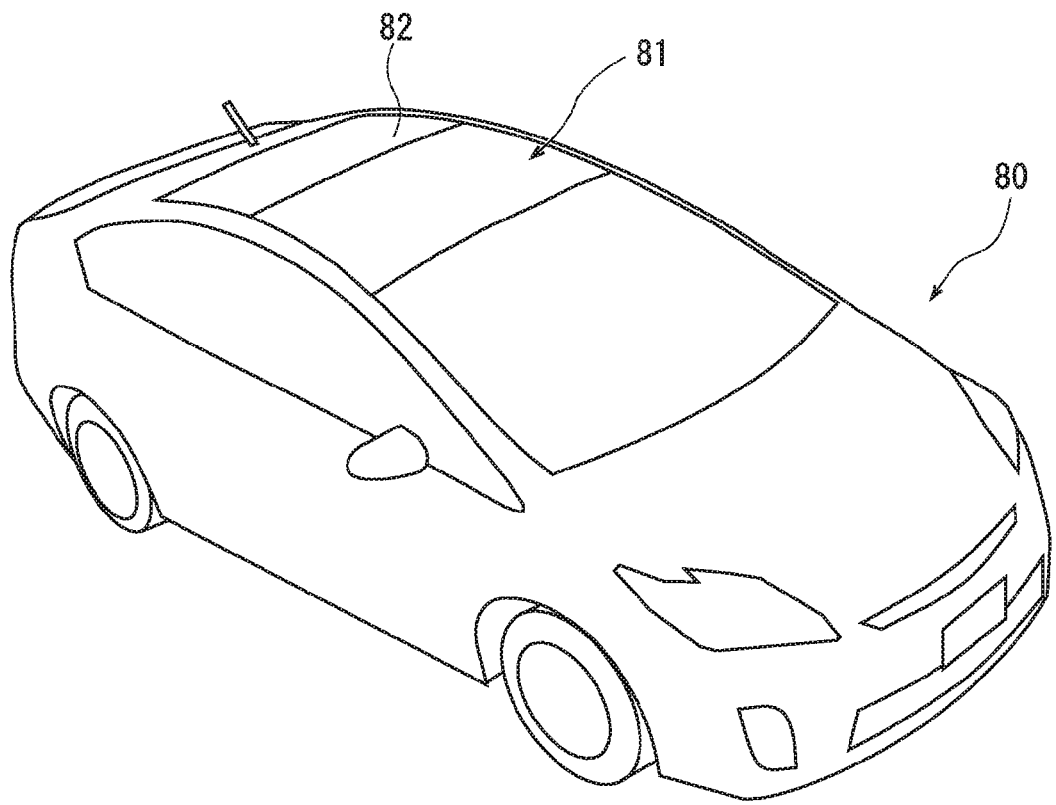
FIG. 14 is a perspective view of a vehicle using a conventional solar panel.
Figure 15:
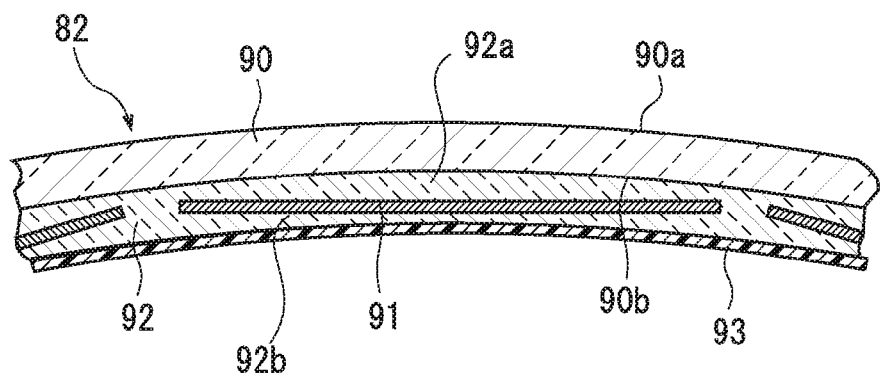
FIG. 15 is an enlarged sectional view of the conventional solar panel.

In the first die 13, a first molding surface 13a capable of molding the front surface 1a of the protection plate 1 is formed. The first molding surface 13a bends along a roof 81, as shown in FIG. 14. Further, as shown in FIGS. 3(A) to 3(C), in the second die 15, a second molding surface 15a that faces the first molding surface 13a is formed. The second molding surface 15a is capable of molding the offset surface 1c and the curved surface 1d of the protection plate 1. When the first die 13 and the second die 15 are closed, the first molding surface 13a and the second molding surface 15a are capable of forming a cavity C1. A gate not illustrated communicates with the cavity C1.

Next, as shown in FIG. 3(B), as an injection step, a molten resin P1 with polycarbonate as a main component is injected into the cavity C1.

Subsequently, as shown in FIG. 3(C), as a die opening step, after the molten resin P1 is solidified, the molding die 11 is opened. In this manner, the protection plate 1 with polycarbonate as the main component is molded.

Figure 4A:
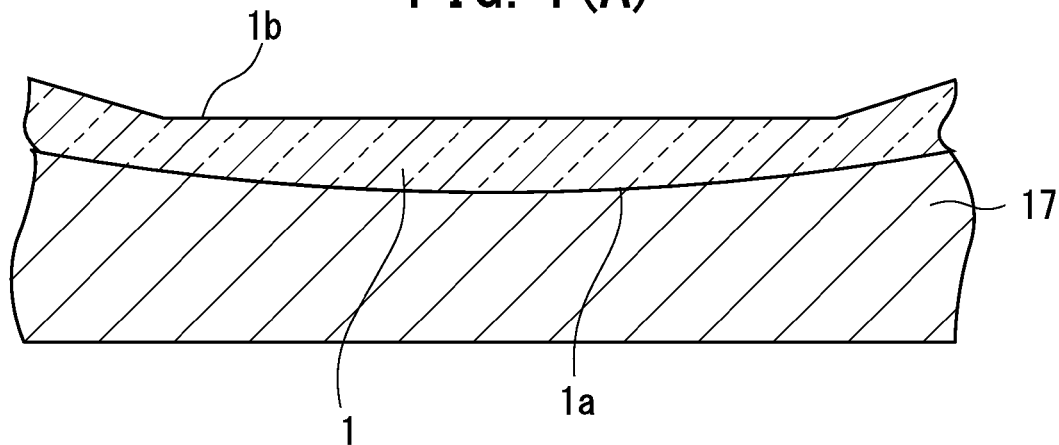
FIG. 4(A) is an enlarged sectional view showing the method for manufacturing the solar panel of embodiment 1.
Figure 4B:
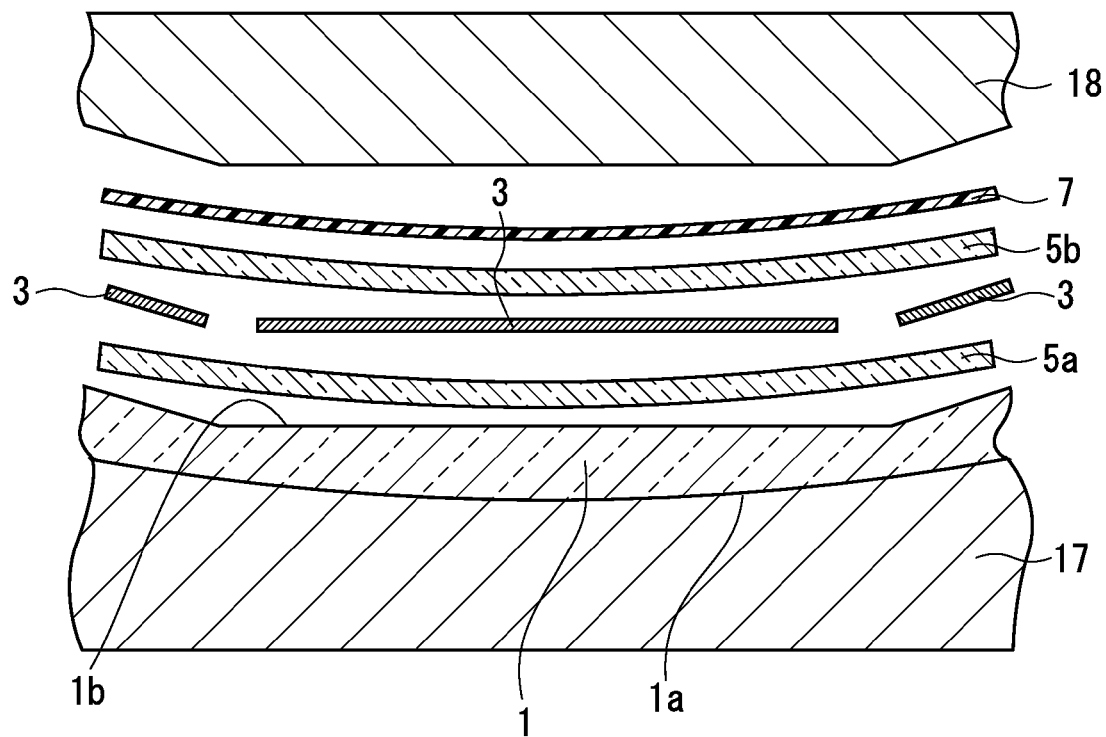
FIG. 4(B) is an enlarged sectional view showing the method for manufacturing the solar panel of embodiment 1.
Figure 4C:
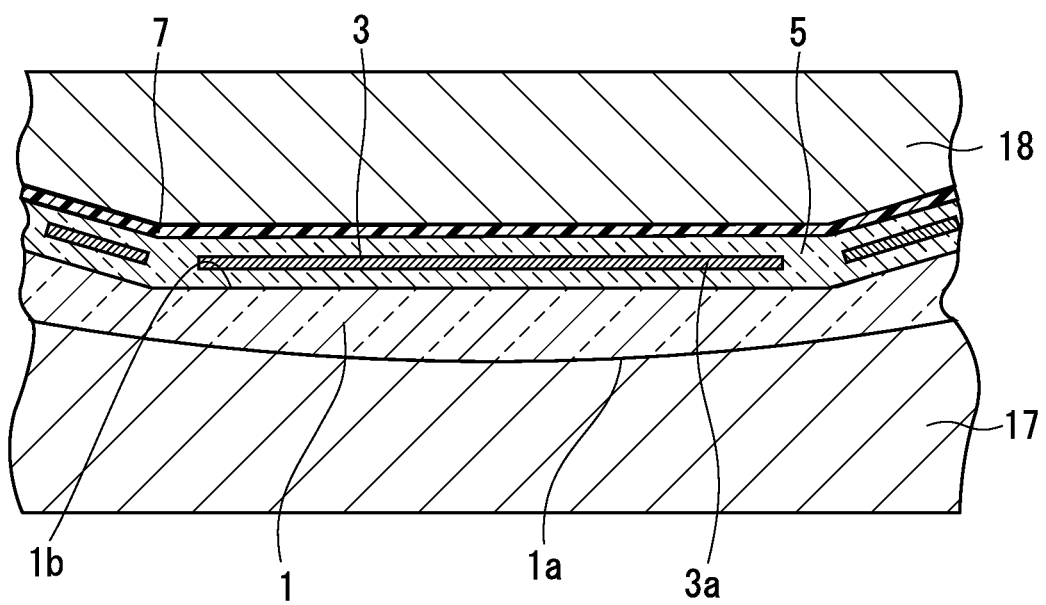
FIG. 4(C) is an enlarged sectional view showing the method for manufacturing the solar panel of embodiment 1.

As shown in FIGS. 4(A) to 4(C), in the next step, a vacuum forming jig 17 and a force plunger 18 are prepared, in place of the molding die 11. As shown in FIG. 4(A), the vacuum forming jig 17 holds the front surface 1a so as to cause the back surface 1b of the protection plate 1 to face upward.

Next, as shown in FIG. 4(B), as a sealing step, the sheet-shaped encapsulant 5a, the respective solar battery cells 3, a sheet-shaped encapsulant 5b, and a film 7 are disposed in sequence on the back surface 1b of the protection plate 1. Thereafter, as shown in FIG. 4(C), the vacuum forming jig 17 and the force plunger 18 bring clearances between the respective members into vacuum state while pressing the respective members. At the same time, the encapsulant 5 is softened by heating, and brings the respective members into close contact with the encapsulant 5. Thus, the respective solar battery cells 3 are fixed to the back surface 1b in the sealed state.

Figure 5:
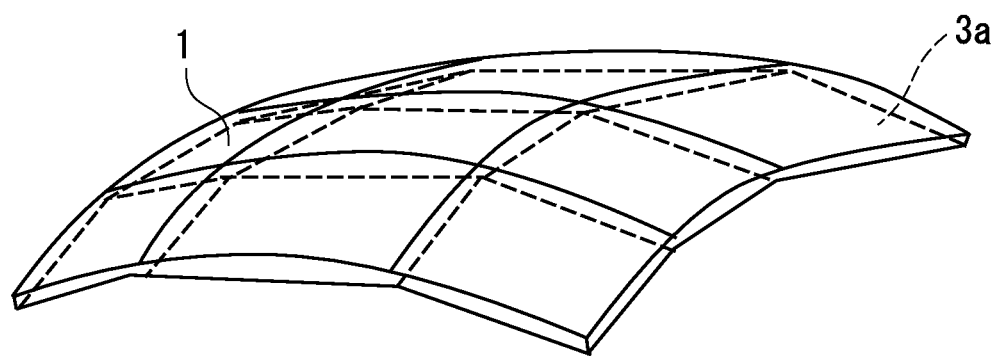
FIG. 5 is a perspective view of the solar panel of embodiment 1.

As shown in FIG. 5, in the solar panel that is obtained in this manner, an entire structure and the front surface 1a (the design surface) of the protection plate 1 are formed into a dome shape, and all the offset surfaces 1c and the cell surfaces 3a are flat surfaces. The solar panel also forms a solar ventilation system in a vehicle similarly to the conventional solar panel. Thus, the solar panel also can supply electric power or the like for ventilating a vehicle interior while the vehicle is parked in the summer season or the like.

In the solar panel, the protection plate 1 is easily formed from a resin by injection molding. In the protection plate 1, the front surface 1a serves as a design surface similarly to the conventional solar panel. Meanwhile, in the protection plate 1, portions of the back surface 1b that face the respective solar battery cells 3 are offset with respect to the solar battery cells 3, and serve as the flat offset surfaces 1c that differ from the design surface in shape. Therefore, a distance between the offset surface 1c and the solar battery cell 3 does not vary in a width direction of the solar battery cell 3. Therefore, when the encapsulant 5 is provided on the back surface 1b of the protection plate 1, adhesion between the protection plate 1 and the solar battery cell 3 is high, and the encapsulant 5 between the back surface 1b and the solar battery cell 3 is less likely to contain air bubbles. Further, since in the sealed state, the solar battery cell 3 is pressed against the offset surface 1c of the protection plate 1, bending force is less likely to be applied to the solar battery cell 3. Therefore, the solar battery cell 3 is less likely to crack in despite of press by the force plunger 18, and power generation efficiency is less likely to be impaired.

Accordingly, the solar panel is capable of exhibiting excellent aesthetics and power generation efficiency, and is capable of preventing cracking of the solar battery cell 3 in the manufacturing process. In particular, in the solar panel, the respective offset surfaces 1c are connected by the bending surfaces 1d. Therefore, straight line portions that are formed when the respective offset surfaces 1c intersect one another to connect to one another are not visible from the solar panel, and the solar panel exhibits excellent outer appearance.

Further, according to the solar panel, a complicated step of bending inorganic glass is not required, and excellent productivity also can be realized.

Embodiment 2

Figure 6:
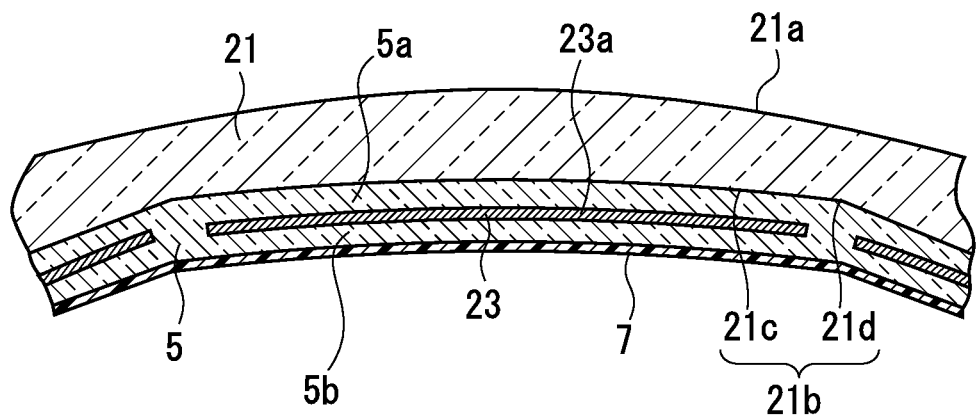
FIG. 6 is an enlarged sectional view of a solar panel of embodiment 2.

As shown in FIG. 6, a solar panel of embodiment 2 is composed of a protection plate 21, a plurality of solar battery cells 23, the encapsulant 5 and the film 7. The protection plate 21 has polycarbonate as a main component. The protection plate 21 has translucency from a front surface 21a that serves as a design surface to a back surface 21b. As the respective solar battery cells 23, crystalline silicon is adopted. Each of the solar battery cells 23, which is flat in the cell surface 3a in ordinary state as shown in FIG. 2, has flexibility capable of bending in one direction. The cell surface that is bent to be a curved surface is assigned with reference sign 23a. As shown in FIG. 6, the encapsulant 5 is integrally provided on the back surface 21b of the protection plate 21. The encapsulant 5 fixes the respective solar battery cells 23 to the back surface 21b in sealed state. The film 7 is provided on a back surface of the encapsulant 5.

The back surface 21b of the protection plate 21 is composed of offset surfaces 21c that face the respective solar battery cells 23, and curved surfaces 21d that connect the respective offset surfaces 21c. The offset surface 21c differs from the front surface 21a of the protection plate 21, and forms a curved surface that is offset with respect to the cell surface 23a of the solar battery cell 23.

Figure 7A:
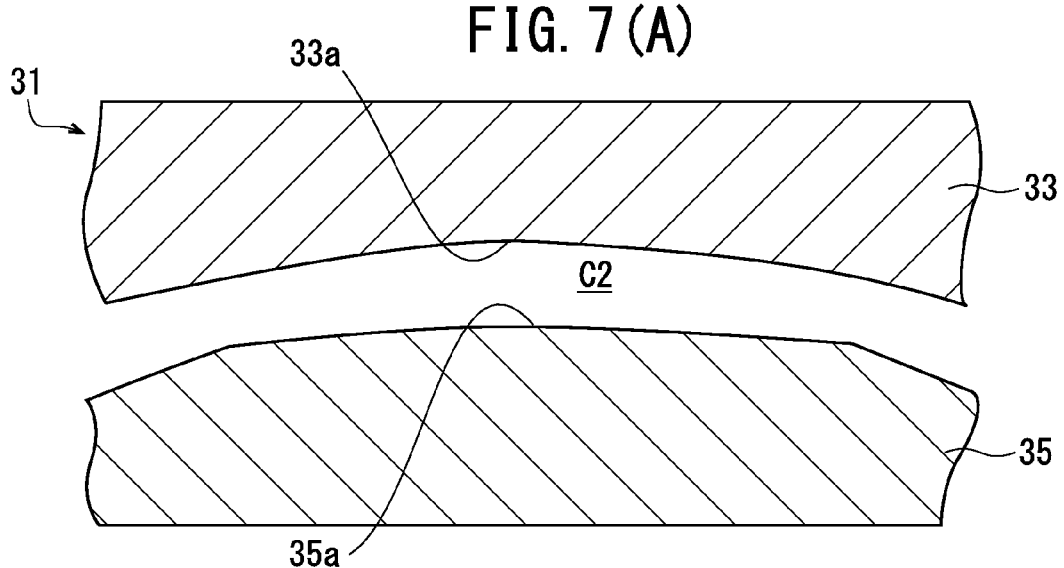
FIG. 7(A) is an enlarged sectional view showing a method for manufacturing the solar panel of embodiment 2.

The solar panel is manufactured as follows. First, as shown in FIG. 7(A), a molding die 31 is prepared as a preparation step. The molding die 31 has a first die 33 and a second die 35.

In the first die 33, a first molding surface 33a capable of molding the front surface 21a of the protection plate 21 is formed. Further, in the second die 35, a second molding surface 35a that faces the first molding surface 33a is formed. The second molding surface 35a is capable of molding the offset surfaces 21c and the curved surfaces 21d of the protection plate 21. When the first die 33 and the second die 35 are closed, the first molding surface 33a and the second molding surface 35a are capable of forming a cavity C2. Agate not illustrated communicates with the cavity C2.

Figure 7B:
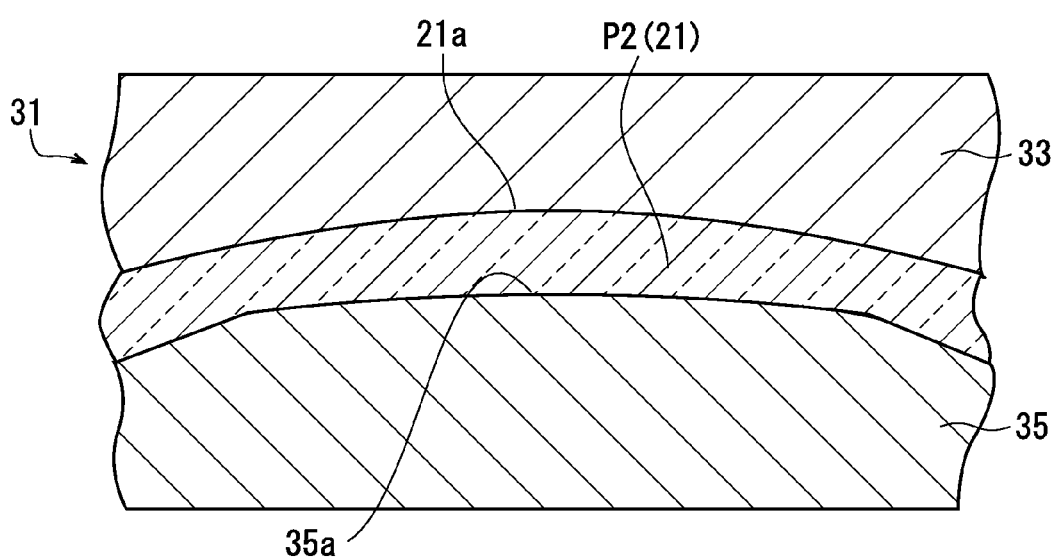
FIG. 7(B) is an enlarged sectional view showing the method for manufacturing the solar panel of embodiment 2.

Next, as shown in FIG. 7(B), as an injection step, a molten resin P2 with polycarbonate as a main component is injected into the cavity C2.

Figure 7C:
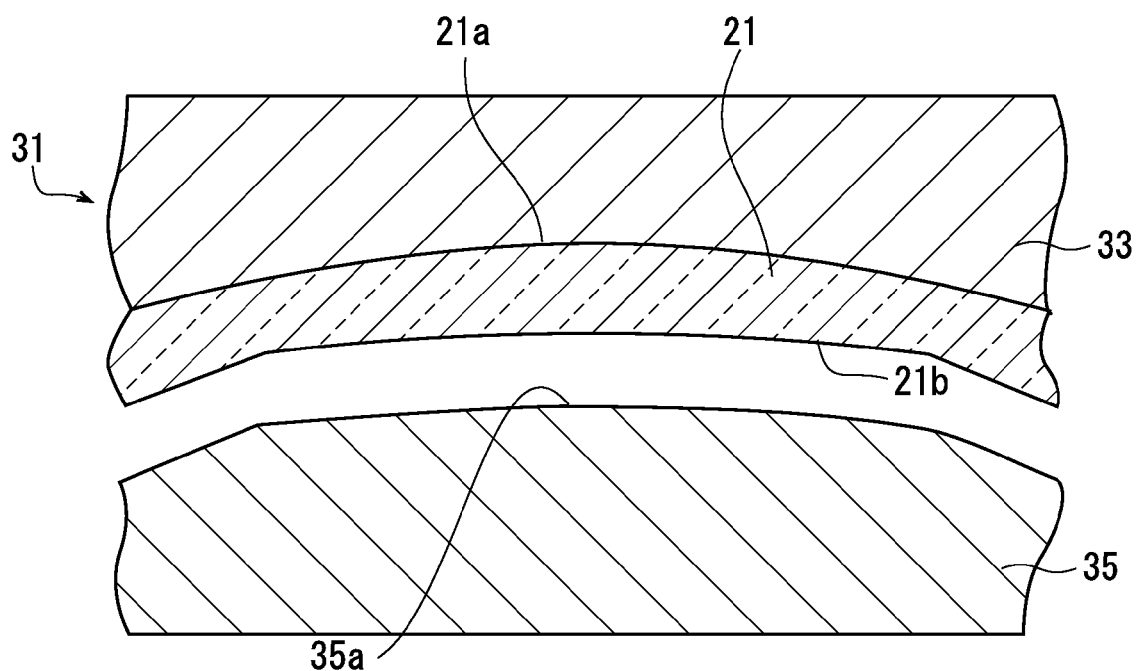
FIG. 7(C) is an enlarged sectional view showing the method for manufacturing the solar panel of embodiment 2.

Subsequently, as shown in FIG. 7(C), as a die opening step, the molding die 31 is opened after the molten resin P2 is solidified. In this manner, the protection plate 21 with polycarbonate as a main component is molded.

Figure 8:
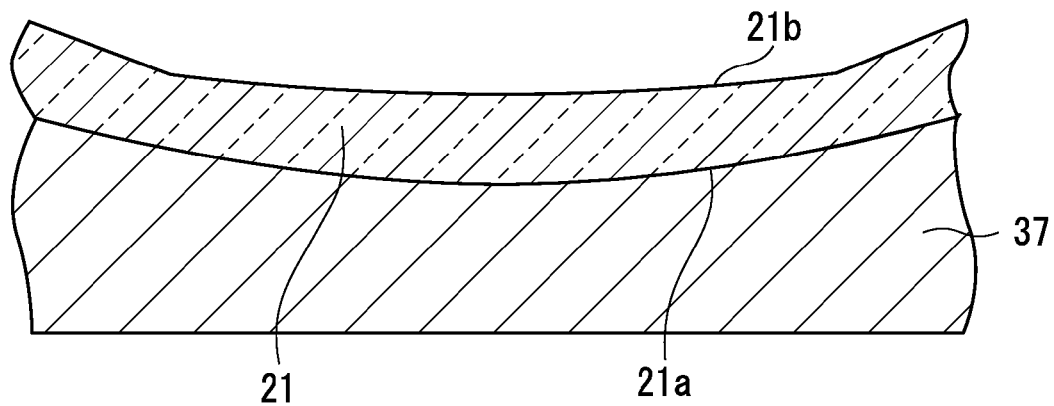
FIG. 8(A) is an enlarged sectional view showing the method for manufacturing the solar panel of embodiment 2.
FIG. 8(B) is an enlarged sectional view showing the method for manufacturing the solar panel of embodiment 2.
FIG. 8(C) is an enlarged sectional view showing the method for manufacturing the solar panel of embodiment 2.
Figure 8:
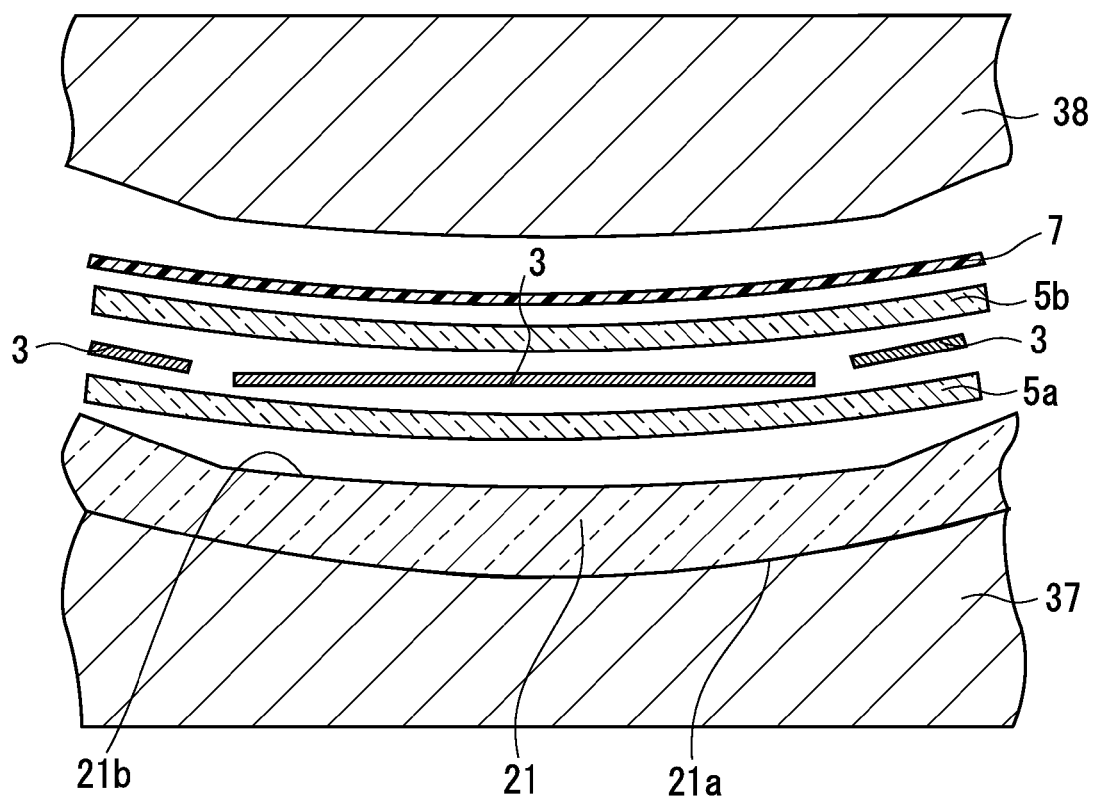
Figure 8C:
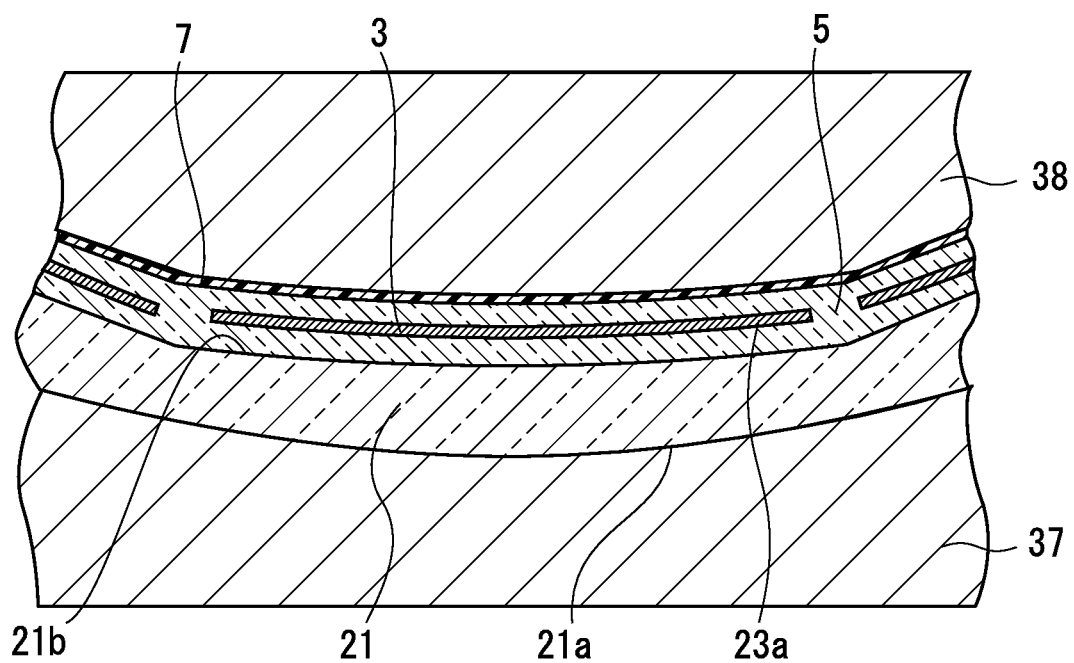

In the next step, in place of the molding die 31, a vacuum forming jig 37 and a force plunger 38 are prepared, as shown in FIGS. 8(A) to 8(C). As shown in FIG. 8(A), the vacuum forming jig 37 holds the front surface 21a so as to cause the back surface 21b of the protection plate 21 to face upward.

Next, as shown in FIG. 8(B), as a sealing step, a sheet-shaped encapsulant 5a, the respective solar battery cells 3, a sheet-shaped encapsulant 5b, and the film 7 are disposed in sequence on the back surface 21b of the protection plate 21. Thereafter, as shown in FIG. 8(C), the vacuum forming jig 37 and the force plunger 38 bring clearances between the respective members into vacuum state while pressing the respective members. At the same time, the encapsulants 5a and 5b are softened by heating to bring the respective members into close contact therewith. Thus, the respective solar battery cells 3 are fixed to the back surface 21b in sealed state.

At this time, even if the respective solar battery cells 3 initially have the cell surfaces 3a that are flat surfaces, the respective solar battery cells 3 become the solar battery cells 23 that have the cell surfaces 23a that are the curved surfaces similarly to the back surface 21b by pressing by the force plunger 38.

Figure 9:
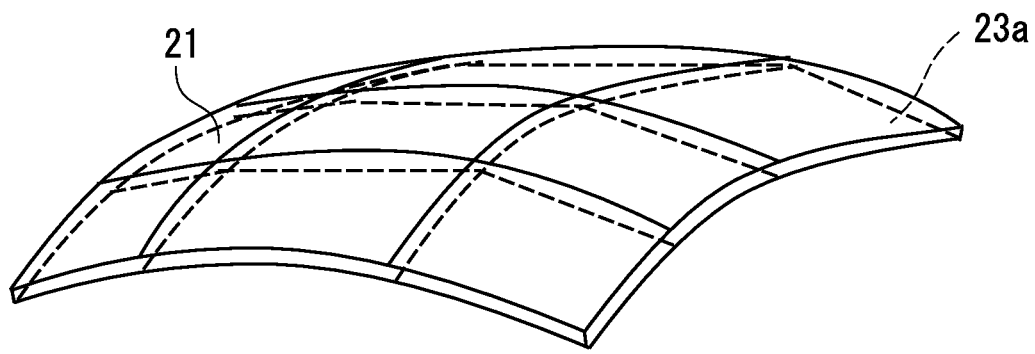
FIG. 9 is a perspective view of the solar panel of embodiment 2.

In the solar panel thus obtained, all the offset surfaces 21c and the cell surfaces 23a are curved surfaces as shown in FIG. 9, and the entire structure and the front surface 21a (the design surface) of the protection plate 21 are in a dome shape. The solar panel is in the shape that more easily conforms to the ceiling surface of a vehicle than that of embodiment 1. The other operations and effects are similar to those in embodiment 1.

Embodiment 3

Figure 13:
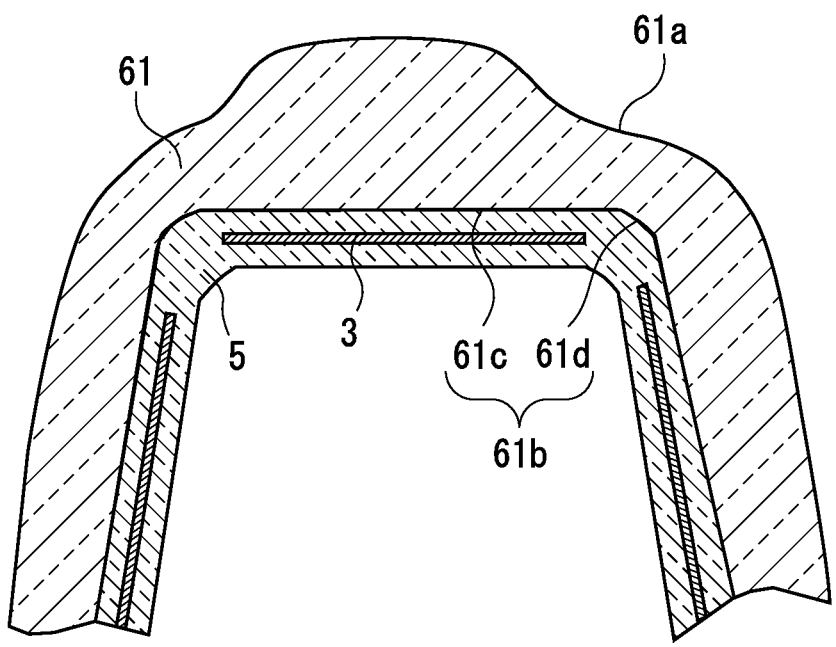
FIG. 13 is an enlarged sectional view of a solar panel of embodiment 3.

As shown in FIG. 13, a solar panel of embodiment 3 is composed of a protection plate 61, the plurality of solar battery cells 3, and the encapsulant 5. The protection plate 61 has a synthetic resin as a main component. The protection plate 61 has translucency from a front surface 61a that serves as a design surface to a back surface 61b. The respective solar battery cells 3 are formed into flat plate shapes. The encapsulant 5 is integrally provided on the back surface 61b of the protection plate 61. The encapsulant 5 fixes the respective solar battery cells 3 to the back surface 61b in sealed state.

The back surface 61b of the protection plate 61 is also composed of flat offset surfaces 61c that face the respective solar battery cells 3 and differ from the front surface 61a, and curved surfaces 61d that connect the respective offset surfaces 61c.

In the solar panel, the front surface 61a that is the design surface has a three-dimensional shape that is more complicated than those in embodiments 1 and 2, but the solar panel provides the operation and effect similar to those of embodiments 1 and 2.

In the above, the present invention is described in accordance with embodiments 1 to 3, but it goes without saying that the present invention is not limited to the above described embodiments 1 to 3, and can be applied by being properly changed within the range without departing from the gist of the invention.

For example, in the present invention, a solar panel also can be composed of the cell surfaces 3a formed by flat surfaces and the cell surfaces 23a formed by curved surfaces.

Figure 10:
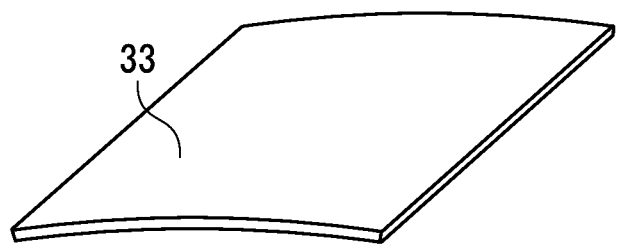
FIG. 10 is a perspective view of a solar battery cell in a curved surface shape according to modification 1.
Figure 11:
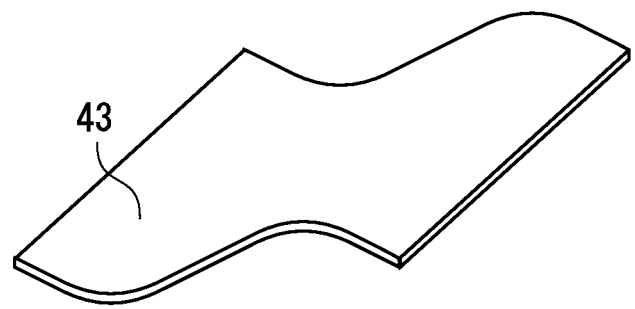
FIG. 11 is a perspective view of a solar battery cell in a ruffled shape according to modification 2.

Further, as shown in FIG. 10, the solar panel of the present invention may adopt a solar battery cell 33 that is formed into a curved surface shape in advance. Similarly, as shown in FIG. 11, the solar panel of the present invention may adopt a solar battery cell 43 that is formed in a ruffled shape in advance.

Figure 12:
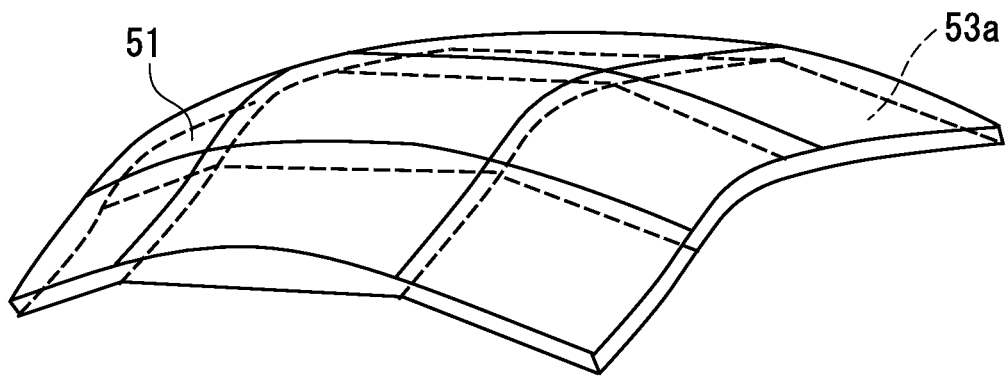
FIG. 12 is a perspective view of a solar panel of modification 3.

Furthermore, as shown in FIG. 12, the solar panel of the present invention may use a protection plate 51 that is formed by offset surfaces and cell surfaces 53a that are formed by various curved surfaces such as a part of a cylindrical surface, a part of a conical surface, a surface with a parabolic section, and a surface with a section in a ruffled shape, and has an entire structure and a front surface (a design surface) formed into a dome shape.

INDUSTRIAL APPLICABILITY

The present invention is usable in a roof of a vehicle, or the like.

REFERENCE SIGNS LIST 1a, 21a, 61a front surface
1b, 21b, 61b back surface
1, 21, 51, 61 protection plate
3, 23, 33, 43 solar battery cell
5 encapsulant
1c, 21c, 61c offset surface
3a, 23a, 53a cell surface
1d, 21d, 61d bending surface
13, 33 first die
C1, C2 cavity 15, 35 second die
11, 31 molding die
P1, P21 molten resin

The invention claimed is:

1. A solar panel comprising:
a protection plate that has translucency from a front surface to a back surface;
a plurality of solar battery cells, wherein each solar battery cell has a front surface and a back surface, the front surface of each solar battery cell facing the back surface of the protection plate; and
an encapsulant that is integrally provided on the back surface of the protection plate and fixes each solar battery cell to the back surface of the protection plate in a sealed state,
wherein the protection plate is formed from a resin and the front surface of the protection plate has a dome shape as viewed in cross-section, and
a plurality of portions of the back surface of the protection plate that faces each solar battery cell serves as a plurality of offset surfaces, the plurality of offset surfaces have a same shape as the front surface of each solar battery cell, and the plurality of offset surfaces have a different shape than the front surface of the protection plate as viewed in cross-section, and a plurality of second portions of the back surface of the protection plate between each of the plurality of offset surfaces, wherein each plurality of second portions of the back surface of the protection plate comprises a bend.

2. The solar panel according to claim 1, wherein all the front and back cell surfaces of solar battery cells are flat surfaces.

3. The solar panel according to claim 1 wherein at least one of front and back surfaces of the solar battery cells is a curved surface.

4. A method for manufacturing a solar panel, comprising:
a preparation step of preparing a molding die that has a first die, and a second die that forms a cavity between the first die and the second die, and the second die is opened with respect to the first die;
an injection step of injecting a molten resin forming a resin having translucency from a front surface to a back surface by solidification into the cavity;
a die opening step of opening the molding die after the molten resin is solidified, and obtaining a protection plate formed from the resin, wherein the protection plate has translucency from a front surface to a back surface; and
a sealing step of disposing a plurality of solar battery cells on the back surface of the protection plate, and providing an encapsulant that fixes the solar battery cells to the back surface of the protection plate in a sealed state, wherein each solar battery cell has a front surface and a back surface, the front surface of each solar battery cell facing the back surface of the protection plate,
wherein the first die and the second die form the cavity in such a manner that a plurality of portions of the back surface of the protection plate that faces each solar battery cell serves as a plurality of offset surfaces, the plurality of offset surfaces have a same shape as the front surface of each solar battery cell, and the plurality of offset surfaces have a different shape than the front surface of the protection plate as viewed in cross-section, and a plurality of second portions of the back surface of the protection plate between each of the plurality of offset surfaces, wherein each plurality of second portions of the back surface of the protection plate comprises a bend.

* * * * *